(12) United States Patent
Nakaiso et al.

(10) Patent No.: US 9,704,799 B2
(45) Date of Patent: Jul. 11, 2017

(54) SEMICONDUCTOR DEVICE (71) Applicant: Murata Manufacturing Co., Ltd., Nagaokakyo-shi, Kyoto-fu (JP)

(72) Inventors: Toshiyuki Nakaiso, Nagaokakyo (JP); Noboru Kato, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/835,794

(22) Filed: Aug. 26, 2015

(65) Prior Publication Data
US 2015/0371941 A1    Dec. 24, 2015

Related U.S. Application Data (63) Continuation of application No. PCT/JP2014/054407, filed on Feb. 25, 2014.

(30) Foreign Application Priority Data

Feb. 28, 2013  (JP) ................................ 2013-039379
Apr. 5, 2013   (JP) ................................ 2013-079960
(Continued)

(51) Int. Cl.
*H01L 29/72*    (2006.01)
*H01L 29/73*    (2006.01)
(Continued)

(52) U.S. Cl.
CPC ........ *H01L 23/528* (2013.01); *H01L 27/0248* (2013.01); *H01L 27/0255* (2013.01); *H01L 27/0814* (2013.01); *H01L 2924/0002* (2013.01)

(58) Field of Classification Search
CPC ............. H01L 29/66106; H01L 29/861; H01L 29/866; H01L 27/0255; H01L 27/0629;
(Continued)

(56) References Cited

U.S. PATENT DOCUMENTS 5,311,042 A    5/1994  Anceau
5,416,358 A    5/1995  Ochi et al.
(Continued)

FOREIGN PATENT DOCUMENTS

JP    H04-17375 A    1/1992
JP    H05-218459 A   8/1993
(Continued)

OTHER PUBLICATIONS

International Search Report issued for PCT/JP2014/054407, date of mailing May 27, 2014.
(Continued)

*Primary Examiner* — Hsien Ming Lee
(74) *Attorney, Agent, or Firm* — Arent Fox LLP (57) ABSTRACT

An ESD protection device includes a Si substrate and a rewiring layer. The rewiring layer includes Ti/Cu/Ti electrodes are electrically connected through contact holes to an ESD protection circuit with Al electrodes films, which is formed at the surface of the Si substrate. The Al electrode film is electrically connected to the Ti/Cu/Ti electrode, whereas the Al electrode film is electrically connected to the Ti/Cu/Ti electrode. A diode forming region is formed between Al electrode films, whereas a diode forming region is formed between Al electrode films. The Ti/Cu/Ti electrode has no overlap with the diode forming region, whereas the Ti/Cu/Ti electrode has no overlap with the diode forming region. Thus, a semiconductor device is provided which is able to reduce the generation of parasitic capacitance, and able to be applied up to a higher frequency band.

4 Claims, 9 Drawing Sheets

(30) Foreign Application Priority Data

| Apr. 5, 2013 | (JP) | 2013-079978 |
|---|---|---|
| May 7, 2013 | (JP) | 2013-097494 |
| May 31, 2013 | (JP) | 2013-115675 |
| Jun. 17, 2013 | (JP) | 2013-126659 |

(51) Int. Cl.
*H01L 23/62* (2006.01)
*H01L 21/332* (2006.01)
*H01L 21/30* (2006.01)
*H01L 23/528* (2006.01)
*H01L 27/08* (2006.01)
*H01L 27/02* (2006.01)

(58) Field of Classification Search
CPC . H01L 27/0727; H01L 27/2409; H01L 23/60; H01L 23/62
USPC ......... 257/173, 175, 355; 438/140, 141, 380
See application file for complete search history.

(56) References Cited

U.S. PATENT DOCUMENTS

| 6,853,089 | B2 | 2/2005 | Ujiie et al. |
|---|---|---|---|
| 7,285,867 | B2 | 10/2007 | Matsuzaki |
| 7,579,632 | B2 | 8/2009 | Salih et al. |
| 8,456,856 | B2 | 6/2013 | Lin |
| 8,558,383 | B2 | 10/2013 | Lin et al. |
| 8,710,645 | B2 | 4/2014 | Shau |
| 2003/0052419 | A1 | 3/2003 | Ujiie et al. |
| 2004/0016971 | A1 | 1/2004 | Abe et al. |
| 2004/0197959 | A1 | 10/2004 | Ujiie et al. |
| 2005/0006760 | A1 | 1/2005 | Terui |
| 2007/0073807 | A1 | 3/2007 | Bobde |
| 2007/0086129 | A1 | 4/2007 | Vos et al. |
| 2007/0210317 | A1 | 9/2007 | Chou et al. |
| 2008/0121988 | A1 | 5/2008 | Mallikararjunaswamy et al. |
| 2008/0265421 | A1 | 10/2008 | Brunnbauer et al. |
| 2009/0079001 | A1 | 3/2009 | Salih et al. |
| 2010/0155962 | A1 | 6/2010 | Inoue |
| 2010/0301459 | A1 | 12/2010 | Akiba et al. |
| 2010/0314660 | A1 | 12/2010 | Salih et al. |
| 2011/0309472 | A1 | 12/2011 | Nakaiso |
| 2012/0068299 | A1 | 3/2012 | Lin |
| 2012/0326207 | A1 | 12/2012 | Yoshimochi |
| 2013/0099353 | A1 | 4/2013 | Kato et al. |
| 2013/0168837 | A1 | 7/2013 | Kato et al. |
| 2014/0332937 | A1 | 11/2014 | Brunnbauer et al. |
| 2015/0371984 | A1 | 12/2015 | Kato et al. |

FOREIGN PATENT DOCUMENTS

| JP | H05-268123 A | 10/1993 |
|---|---|---|
| JP | H11-54708 A | 2/1999 |
| JP | 2002-176106 A | 6/2002 |
| JP | 2002-252309 A | 9/2002 |
| JP | 2002270720 A | 9/2002 |
| JP | 2003-092374 A | 3/2003 |
| JP | 2003-124222 A | 4/2003 |
| JP | 2004-119870 A | 4/2004 |
| JP | 2004-158758 A | 6/2004 |
| JP | 2004-281898 A | 10/2004 |
| JP | 2005-032782 A | 2/2005 |
| JP | 2005-340573 A | 12/2005 |
| JP | 2006049511 A | 2/2006 |
| JP | 2006173476 A | 6/2006 |
| JP | 2006-277742 A | 11/2006 |
| JP | 2007-123538 A | 5/2007 |
| JP | 2008141136 A | 6/2008 |
| JP | 2009-016882 A | 1/2009 |
| JP | 2009515323 A | 4/2009 |
| JP | 2010-087113 A | 4/2010 |
| JP | 2010-510662 A | 4/2010 |
| JP | 2010-512003 A | 4/2010 |
| JP | 2010-278040 A | 12/2010 |
| JP | 2012-146717 A | 8/2012 |
| JP | 2012-182381 A | 9/2012 |
| WO | WO 2011/152255 A1 | 12/2011 |
| WO | WO 2012/023394 A1 | 2/2012 |
| WO | WO 2014162795 A1 | 10/2014 |

OTHER PUBLICATIONS

Written Opinion of the International Searching Authority issued for PCT/JP2014/054407, date of mailing May 27, 2014.
International Search Report issued for PCT/JP2014/054404, date of mailing May 27, 2014.
International Search Report issued for PCT/JP2014/054406, date of mailing May 27, 2014.
Written Opinion of the International Search Authority for PCT/JP2014/054403, date of mailing May 27, 2014.
Written Opinion of the International Searching Authority for PCT/JP2014/054406, date of mailing May 27, 2014.
Written Opinion of the International Searching Authority issued for PCT/JP2014/054404, date of mailing May 27, 2014.
International Search Report issued for PCT/JP2014/054403, date of mailing May 27, 2014.

SEMICONDUCTOR DEVICE

CROSS REFERENCE TO RELATED APPLICATIONS

The present application is a continuation of PCT/JP2014/054407 filed Feb. 25, 2014, which claims priority to JP Application No. 2013-126659, filed Jun. 17, 2013, JP Application No. 2013-115675, filed May 31, 2013, JP Application No. 2013-097494, filed May 7, 2013, JP Application No. 2013-079960, filed Apr. 5, 2013, JP Application No. 2013-079978, filed Apr. 5, 2013, and JP Application No. 2013-039379, filed Feb. 28, 2013, the entire contents of each of which are incorporated herein by reference.

FIELD OF THE INVENTION

The present invention relates to a semiconductor device including a rewiring layer on a semiconductor substrate with a functional element formed.

BACKGROUND OF THE INVENTION

An ESD (Electro-Static-Discharge) protection device as a type of semiconductor devices. The ESD protection device protects semiconductor ICs, etc. from static electricity, etc. Various electronic devices including mobile communication terminals, digital cameras, and laptop PCs are provided with semiconductor integrated circuits constituting logic circuits, memory circuits, etc. Such semiconductor integrated circuits are low-voltage drive circuits composed of micro wiring patterns formed on semiconductor substrates, and thus generally fragile against electrostatic discharge such as surge. Therefore, ESD protection devices are used for protecting such semiconductor integrated circuits from surge.

When an ESD protection device is provided in a high-frequency circuit, there is the problem of being affected by parasitic capacitance of a diode. More specifically, the insertion of the ESD device into the signal line shifts impedance under the influence of the parasitic capacitance of the diode, and as a result, loss of signal may be caused. In particular, ESD protection devices for use in high-frequency circuits are required to be low in parasitic capacitance, in order not to decrease high-frequency characteristics of signal lines connected or integrated circuits to be protected. Thus, Patent Document 1 discloses an ESD protection device with circuit characteristic degradation suppressed by reducing the influence of the parasitic capacitance of a diode.

Patent Document 1: WO 2012/023394 A.

In Patent Document 1, on a surface of a semiconductor substrate with an ESD protection circuit, an inorganic insulating layer of $SiO_2$ is provided as a protection film, and the inorganic insulating layer is provided with an in-plane wiring of Cu. For this reason, Patent Document 1 has problems such as failure to prevent the capacitance of the ESD protection device itself from being increased, due to the fact that it is not possible to suppress the parasitic capacitance generated between the in-plane wiring and the semiconductor substrate even when it is possible to reduce the influence of parasitic capacitance of the diode. Furthermore, the generation of parasitic capacitance puts a limit on the high-frequency band, and also has problems such as losing the ability to use the ESD protection circuit in the high-frequency band.

SUMMARY OF THE INVENTION

Therefore, an object of the present invention is to provide a semiconductor device which is able to reduce the generation of parasitic capacitance, and able to be applied up to a higher frequency band.

The semiconductor device according to the present invention includes: a semiconductor substrate with a functional element formed; and a rewiring layer including a first wiring electrode and a second wiring electrode opposed to the surface of the semiconductor substrate, a first contact hole that electrically connects the functional element and a part of the first wiring electrode, and a second contact hole that electrically connects the functional element and a part of the second wiring electrode, and characteristically, the functional element has: a first input/output electrode formed on the surface, and electrically connected to the first wiring electrode through the first contact hole; a second input/output electrode formed on the surface, and electrically connected to the second wiring electrode through the second contact hole; an intermediate wiring electrode formed on the surface, and isolated from the first input/output electrode and the second input/output electrode; a first diode forming region formed between the first input/output electrode and the intermediate wiring electrode; and a second diode forming region formed between the second input/output electrode and the intermediate wiring electrode, the first wiring electrode has no overlap with the second diode forming region in planar view, and the second wiring electrode has no overlap with the first diode forming region in planar view.

In this configuration, the generation of unnecessary parasitic capacitance can be prevented between the first wiring electrode and the second diode forming region, and between the second wiring electrode and the first diode forming region. The reduced parasitic capacitance can achieve application up to a higher frequency band The functional element is an ESD protection circuit, and the first wiring electrode and the second wiring electrode preferably serve as a current path for ESD current.

As a result, the suppressed generation of parasitic capacitance can reduce the shift in impedance for high-frequency circuits that are ESD protection devices, and loss of signal can be reduced for the high-frequency circuits.

Preferably, the first diode forming region is provided with a first comb-shaped electrode electrically connected to the first input/output electrode and a second comb-shaped electrode electrically connected to the intermediate wiring electrode, whereas the second diode forming region is provided with a third comb-shaped electrode electrically connected to the intermediate wiring electrode and a fourth comb-shaped electrode electrically connected to the second input/output electrode.

This configuration can constitute diodes that are low in ESL and high in ampacity in a limited occupied area.

Preferably, the intermediate wiring electrode has: a pair of first intermediate wiring electrode and second intermediate wiring electrode provided to be opposed in a first direction that is a longitudinal direction; and a third intermediate wiring electrode provided in a second direction orthogonal to the first direction, which electrically connects the first intermediate wiring electrode and the second intermediate wiring electrode, the first input/output electrode and the second input/output electrode are provided in regions surrounded by the first intermediate wiring electrode and the second intermediate wiring electrode as well as the third intermediate wiring electrode, and provided to be opposed with the third intermediate wiring electrode interposed therebetween, the first diode forming region is formed between the first input/output electrode and the first intermediate wiring electrode, the second diode forming region is formed between the second input/output electrode and the second intermediate wiring electrode, the first wiring electrode is shaped to be opposed to the first intermediate wiring electrode, the region between the first intermediate wiring electrode and the second input/output electrode, and the second input/output electrode, and the second wiring electrode is shaped to be opposed to the second intermediate wiring electrode, the region between the second intermediate wiring electrode and the first input/output electrode, and the first input/output electrode.

As a result, the suppressed generation of parasitic capacitance can reduce the shift in impedance for high-frequency circuits that are ESD protection devices, and loss of signal can be reduced for the high-frequency circuits.

According to the present invention, unnecessary parasitic capacitance can be prevented from being generated, and the reduced parasitic capacitance can achieve application up to a higher frequency band.

DETAILED DESCRIPTION OF THE EXEMPLARY EMBODIMENTS

Hereinafter, the semiconductor device according to the present invention will be described with reference to ESD protection devices as examples.

Figure 1:
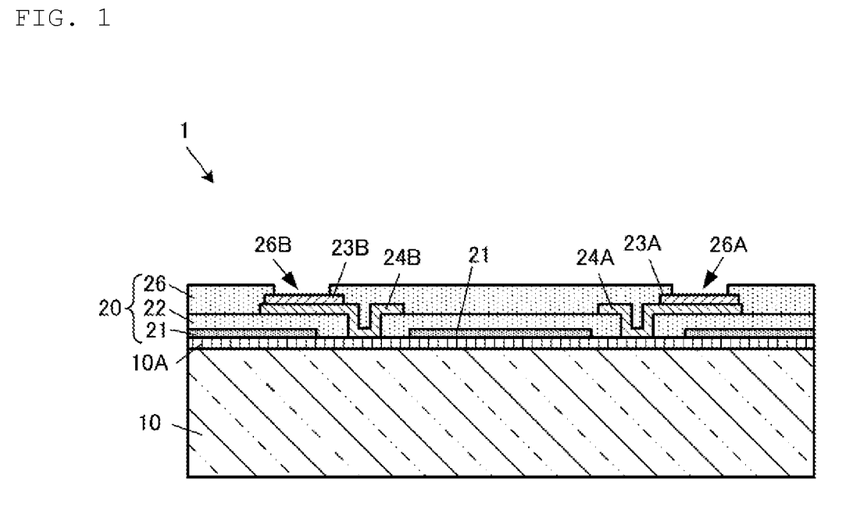
FIG. 1 is a front cross-sectional view of an ESD protection device according to an embodiment.
Figure 2:
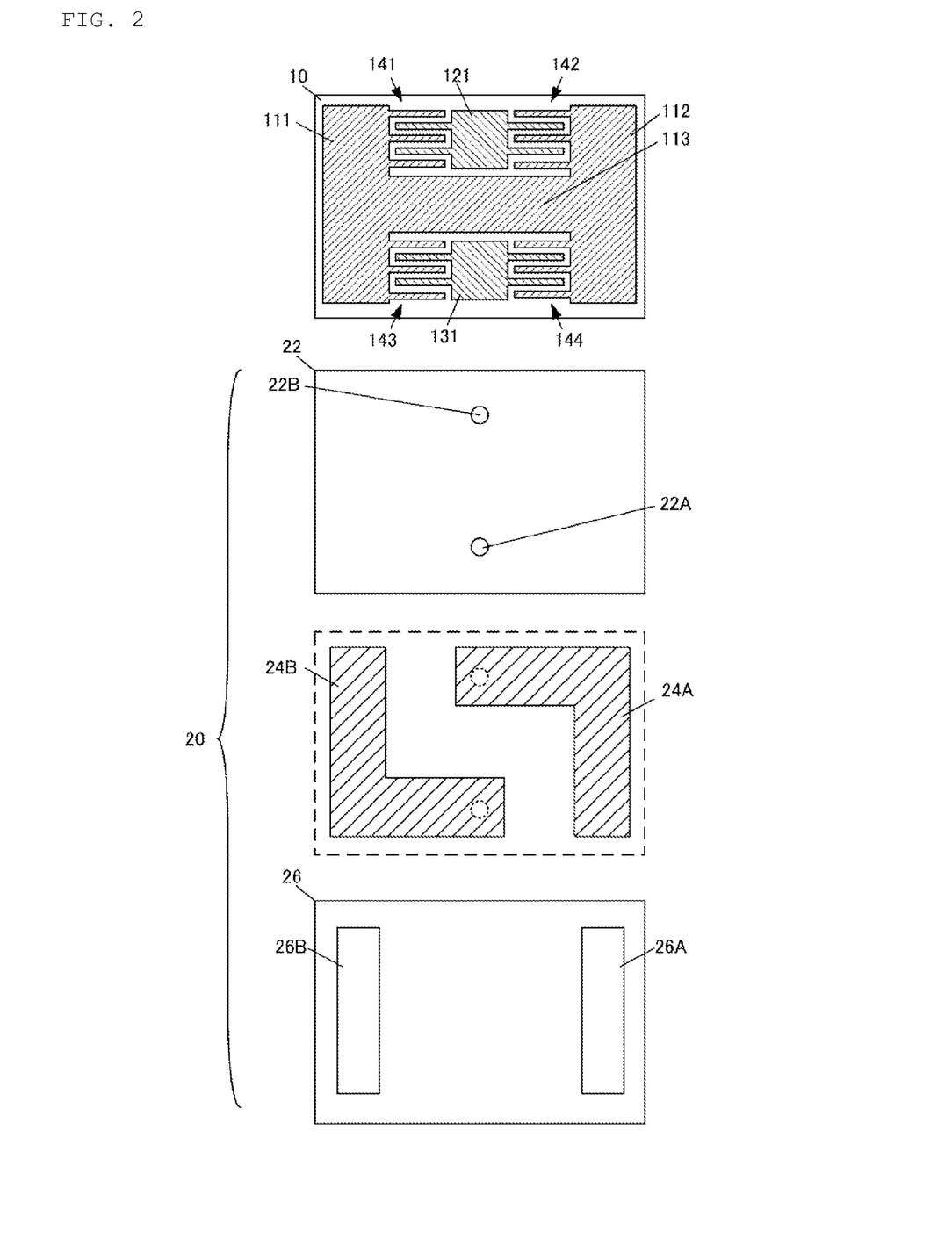
FIG. 2 is a plan view of respective layers of the ESD protection device.

FIG. 1 is a front cross-sectional view of an ESD protection device 1 according to the present embodiment. FIG. 2 is a plan view of respective layers of the ESD protection device 1. The ESD protection device 1 is a CSP (Chip Size Package) type device, where a rewiring layer 20 including multiple resin layers, etc. is formed on a Si substrate 10 configured to have an ESD protection circuit 10A including a diode and a zener diode. While the Si substrate 10 corresponds to a semiconductor substrate according to the present invention, the semiconductor substrate according to the present invention is not limited to any Si substrate, but may be a GaAs substrate or the like.

Figure 3:
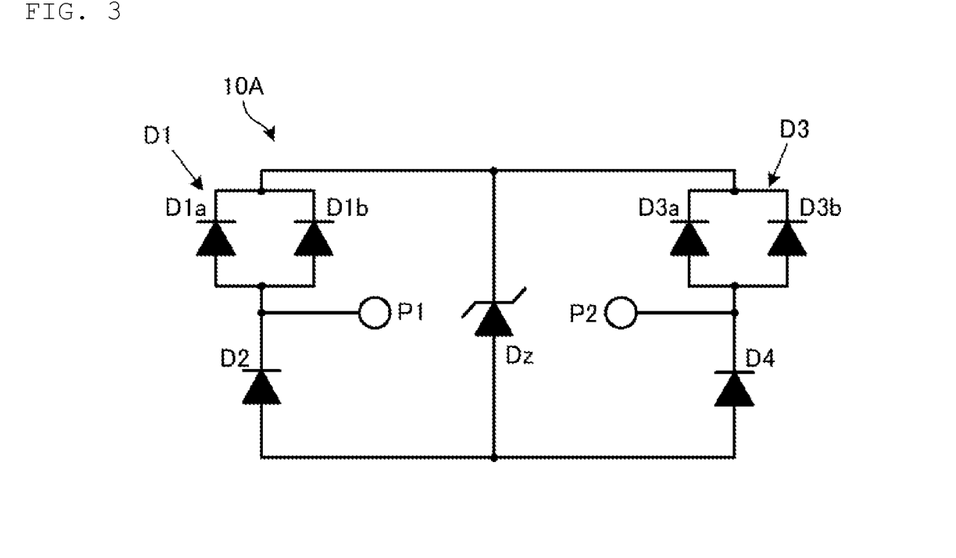
FIG. 3 is a diagram illustrating an ESD protection circuit formed on a Si substrate.
Figure 4:
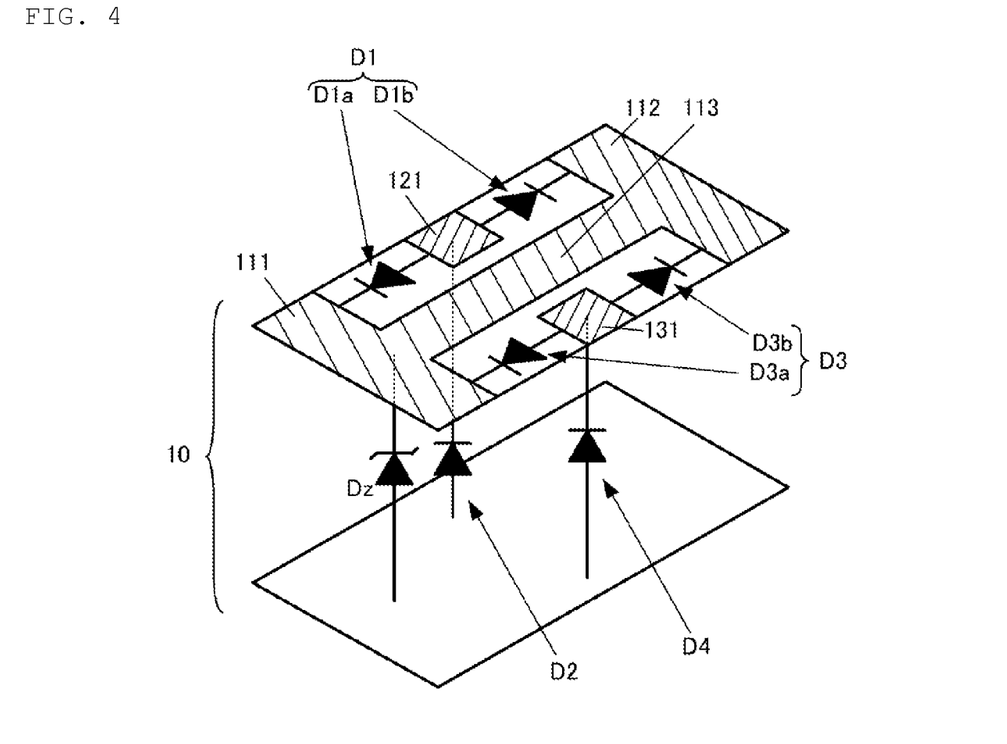
FIG. 4 is a diagram illustrating a structure example of the ESD protection circuit.

FIG. 3 is a diagram illustrating the ESD protection circuit 10A formed on the Si substrate 10. FIG. 4 is a diagram illustrating a structure example of the ESD protection circuit 10A.

The Si substrate 10 has element forming regions formed, and the regions have Al electrode films 111, 112, 113, 121, 131 provided. The Al electrode films 111, 112 are provided parallel along a direction orthogonal to the longitudinal direction of the rectangular Si substrate 10 (hereinafter, referred to as a shorter direction). The Al electrode film 113 is formed in the longitudinal direction of the Si substrate 10, and electrically connects the Al electrode film 111, 112. The region with the Al electrode films 111, 112, 113 provided has a zener diode Dz formed in the thickness direction of the Si substrate 10. The Al electrode film 111 corresponds to a first intermediate wiring electrode according to the present invention, the Al electrode film 112 corresponds to a second intermediate wiring electrode according to the present invention, and the Al electrode film 113 corresponds to a third intermediate wiring electrode according to the present invention.

The Al electrode films 121, 131 are formed in regions surrounded by the Al electrode films 111, 112, 113. More specifically, the Al electrode films 121, 131 are formed so as to have the Al electrode film 113 interposed therebetween, between the Al electrode films 111, 112. The Al electrode film 121 corresponds to a first input/output electrode according to the present invention, whereas the Al electrode film 131 corresponds to a second input/output electrode according to the present invention. A diode D2 is formed in the thickness direction of the Si substrate 10 in the region with the Al electrode film 121 provided, whereas a diode D4 is formed in the thickness direction of the Si substrate 10 in the region with the Al electrode film 131 provided. The Al electrode film 121, 131 serve as input/output terminals of the ESD protection circuit 10A.

Diode forming regions 141, 142, 143, and 144 are formed respectively between the Al electrode films 111, 121, between the Al electrode films 112, 121, between the Al electrode films 111, 131, and between the Al electrode films 112, 131. The diode forming region 141 corresponds to a first diode forming region according to the present invention, the diode forming region 144 corresponds to a second diode forming region according to the present invention. It is to be noted that the formation of the diode forming regions 142, 143 may be skipped.

The diode forming regions 141, 142, 143, 144 each have a pair of opposed comb-shaped electrode films formed, and diodes D1a, D1b, D3a, D3b are formed in the respective regions. One of the comb-shaped electrode films in the diode forming region 141 is connected to the Al electrode film 111, whereas the other thereof is connected to the Al electrode film 121. One of the comb-shaped electrode films in the diode forming region 142 is connected to the Al electrode film 121, whereas the other thereof is connected to the Al electrode film 112. One of the comb-shaped electrode films in the diode forming region 143 is connected to the Al electrode film 111, whereas the other thereof is connected to the Al electrode film 131. One of the comb-shaped electrode films in the diode forming region 144 is connected to the Al electrode film 131, whereas the other thereof is connected to the Al electrode film 112. The formation of the diodes with the comb-shaped electrodes can constitute diodes that are low in ESL and high in ampacity in a limited occupied area.

Figure 5:
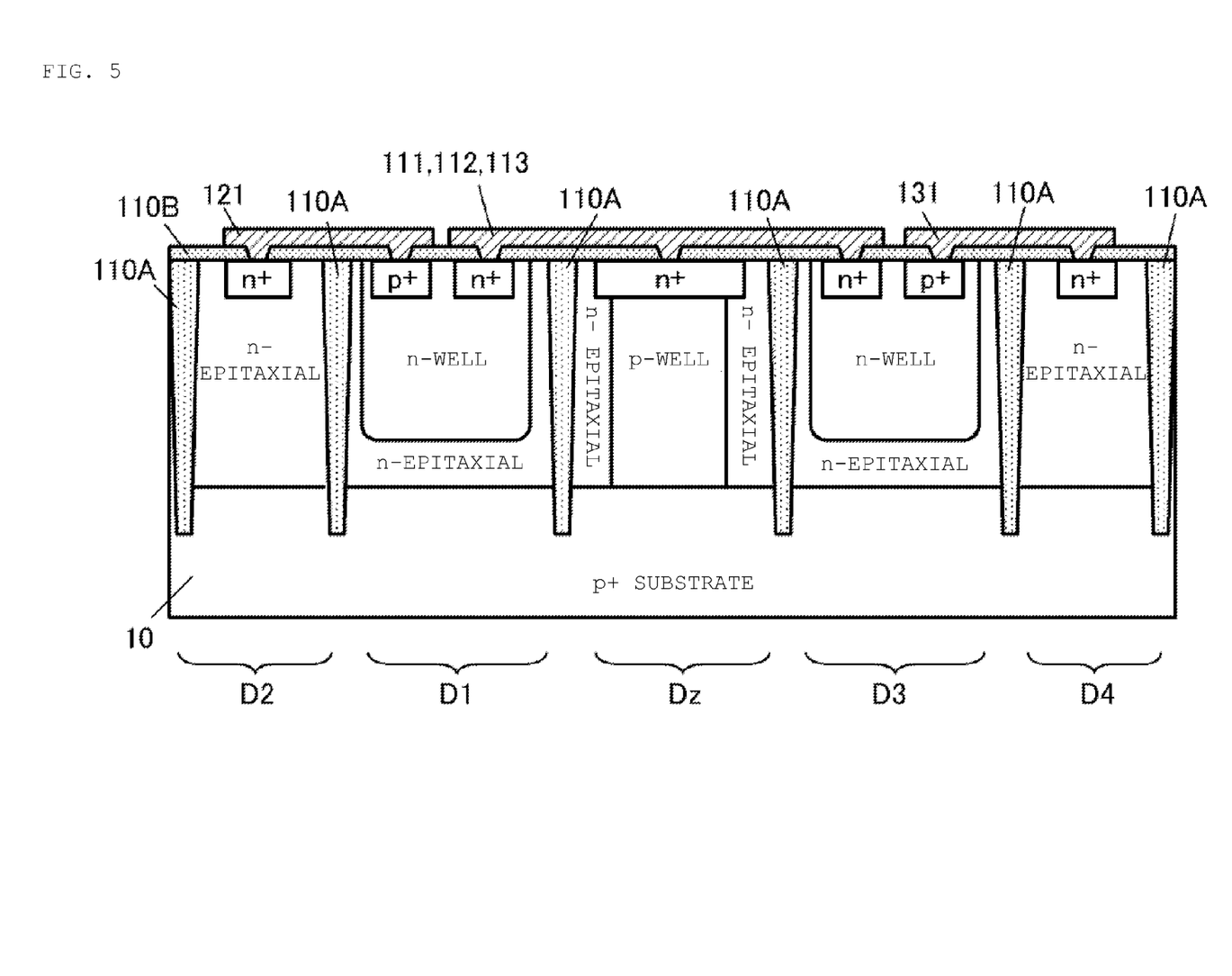
FIG. 5 is a pattern diagram of the Si substrate of the structure shown in FIG. 4.

The specific configuration of the Si substrate 10 will be described below. FIG. 5 is a pattern diagram of the Si substrate 10 of the structure shown in FIG. 4.

The Si substrate 10 is a p+ type substrate, and the p+ type substrate has element separation films 110A formed by a STI (Shallow Trench Isolation) method. The diodes D1 to D4 and the zener diode Dz are formed in the respective regions formed by the element separation film 110A. Specifically, an n-epitaxial layer is formed and n+ diffusion layers form the diodes D2, D4 in the thickness direction of the Si substrate 10. In addition, a p well is formed, and an n+ diffusion layer forms the zener diode Dz in the thickness direction of the Si substrate 10. Furthermore, n wells are formed in the n-epitaxial layers, and p+ diffusion layers and n+ diffusion layers form the diodes D1, D3 at the surface of the Si substrate 10.

On the surface of the Si substrate 10, a $SiO_2$ film 110B is formed, the Al electrode film 121 is formed so as to connect an anode of the diode D1 and a cathode of the diode D2, and the Al electrode film 131 is formed so as to connect an anode of the diode D3 and a cathode of the diode 4. Furthermore, the Al electrodes 111, 121, 131 are formed on the diodes D1, D3, and the surface of the Si substrate 10, except the regions with the Al electrode films 121, 131 formed.

The thus formed ESD protection circuit 10A of the Si substrate 10 corresponds with the circuit shown in FIG. 3. It is to be noted that the diodes D1a, D1b are regarded as the diode D1, whereas the diodes D3a, D3b are regarded as the diode D3 in FIG. 3.

The diodes D1, D2, D3, D4 and the zener diodes Dz correspond to functional elements according to the present invention.

The diodes D1, D2 are aligned in the forward direction and connected in series, whereas the diodes D3, D4 are aligned in the forward direction and connected in series. In addition, the diodes D1, D2 and the diodes D3, D4 are each aligned in the forward direction, and connected in parallel with the zener diode Dz. Furthermore, the zener diode Dz is formed between the forming regions of the diodes D1, D4, and between the forming regions of the diodes D2, D3.

Returning to FIG. 1, the rewiring layer 20 formed on the surface layer of the Si substrate 10 includes a protection film 21 formed on the surface of the Si substrate 10 and a resin layer 22. This protection film 21 is SiN or $SiO_2$. The protection film 21, which is made by sputtering on the surface of the Si substrate 10, has openings formed by etching. These openings are formed so as to partially expose the Al electrode films 121, 131 of the Si substrate 10. The resin layer 22 is formed by spin coating with an epoxy (or polyimide) solder resist. The resin layer 22 has contact holes 22A, 22B formed for exposing parts of the Al electrode films 121, 131.

Ti/Cu/Ti electrodes 24A, 24B are formed in the contact holes 22A, 22B and on regions around the contact holes 22A, 22B. The Ti/Cu/Ti electrodes 24A, 24B have planar parts opposed to the surface of the Si substrate 10, and have electrical connection to the Al electrode film 121, 131 through the contact holes 22A, 22B of the resin layer 22. The Ti/Cu/Ti electrodes 24A, 24B serve as current pathways for surge current (ESD current) through the ESD protection device 1.

External electrodes 23A, 23B of Au/Ni are formed partially on the planar parts of the Ti/Cu/Ti electrodes 24A, 24B. The parts of the Ti/Cu/Ti electrodes 24A, 24B, on which the external electrodes 23A, 23B are formed, are etched to have Cu exposed, and the exposed Cu parts are selectively etched with the external electrodes 23A, 23B. These external electrodes 23A, 23B serve as terminal electrodes for input/output to/from the ESD protection device 1. The Ti/Cu/Ti electrode 24A corresponds to a first wiring electrode according to the present invention, whereas the Ti/Cu/Ti electrode 24B corresponds to a second wiring electrode according to the present invention.

The Ti/Cu/Ti electrode 24A is formed so as to be opposed to the Al electrode films 112, 121 and diode forming region 142 formed in the Si substrate 10, but not to be opposed to the diode forming region 144 in the thickness direction of the ESD protection device 1. The Ti/Cu/Ti electrode 24B is formed so as to be opposed to the Al electrode films 111, 131 and diode forming region 143 formed in the Si substrate 10, but not to be opposed to the diode forming region 141 in the thickness direction of the ESD protection device 1.

The Ti/Cu/Ti electrodes 24A, 24B cover the zener diode Dz formed in the Si substrate 10 to prevent noise radiation from the zener diode. Furthermore, due to the fact that the Ti/Cu/Ti electrode 24A is not opposed to the diode forming region 144, whereas the Ti/Cu/Ti electrode 24B is not opposed to the diode forming region 141, unnecessary parasitic capacitance is reduced to enable the use up to a higher frequency band without shifting impedance matching.

The rewiring layer 20 includes a resin layer 26 further formed on the resin layer 22. The resin layer 26 is, for example, a layer of low-dielectric-constant epoxy resin. Parts of the resin layer 26, which are opposed to parts of the Ti/Cu/Ti electrodes 24A, 24B treated as input/output terminals of the ESD protection device 1, have rectangular openings 26A, 26B formed.

It is to be noted that while an example of forming the zener diode Dz and the like in the Si substrate 10 to constitute the ESD protection circuit 10A has been provided in the present embodiment, for example, a PNP-type semiconductor or an NPN-type semiconductor may be formed in the Si substrate 10 to constitute a circuit with the use of the semiconductor.

The reason that parasitic capacitance can be reduced when the Ti/Cu/Ti electrodes 24A, 24B have no overlap with the diode forming regions 141, 144 will be described below.

First, connection examples and a principle for operation will be described with the ESD protection device according to the present embodiment.

Figure 6A:
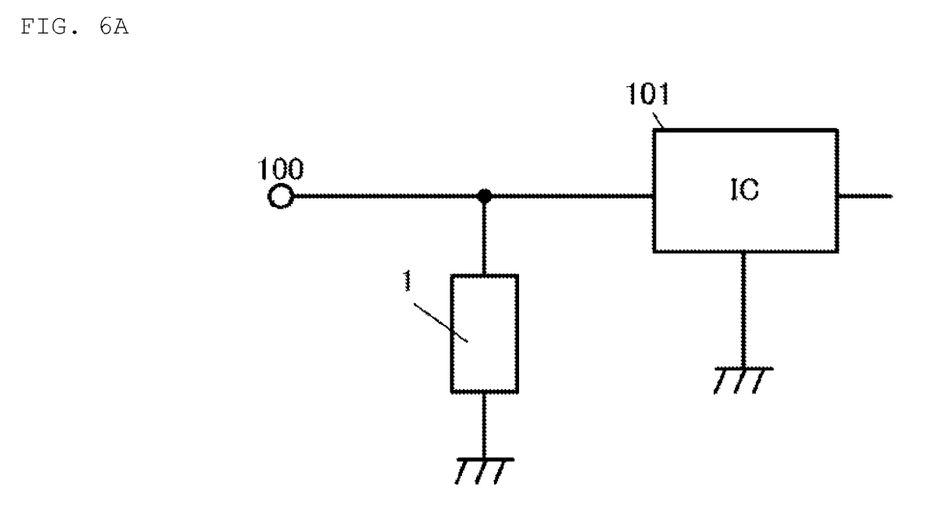
FIG. 6A is a diagram illustrating an example of connecting an ESD protection device according to an embodiment.
Figure 6B:
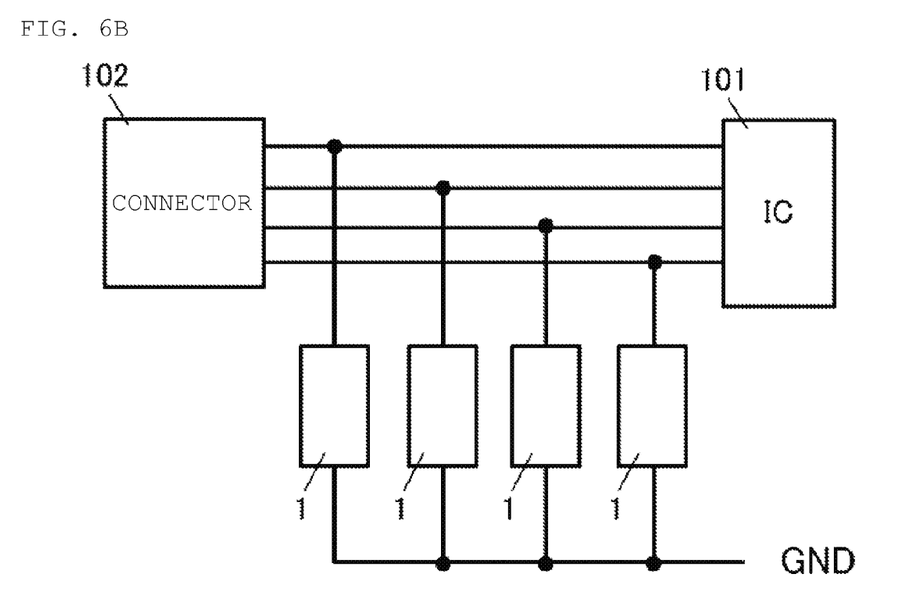
FIG. 6B is a diagram illustrating an example of connecting an ESD protection device according to an embodiment.

FIGS. 6A and 6B are diagrams illustrating examples of connecting the ESD protection device 1 according to the present embodiment. The ESD protection device 1 is mounted on an electronic device. Examples of the electronic device include laptop PCs, tablet terminals, cellular phones, digital cameras, and portable music players.

FIG. 6A shows an example of connecting the ESD protection device 1 between a signal line connecting an I/O port 100 and an IC 101 to be protected, and GND. The I/O port 100 is, for example, a port to which an antenna is connected. The ESD protection device 1 according to the present embodiment is bidirectional, and any of the first input/output terminal and second input/output terminal may serve as an input terminal. For example, when the first input/output terminal is treated as an input terminal, the first input/output terminal is connected to the signal line, whereas the second input/output terminal is connected to the GND.

FIG. 6B shows an example of connecting the ESD protection devices 1 between signal lines connecting a connector 102 and an IC 101, and a GND line. The signal lines in this example are, for example, high-speed transmission lines (differential transmission lines), and the ESD protection device 1 is connected between each of the multiple signal lines and the GND line.

Figure 7:
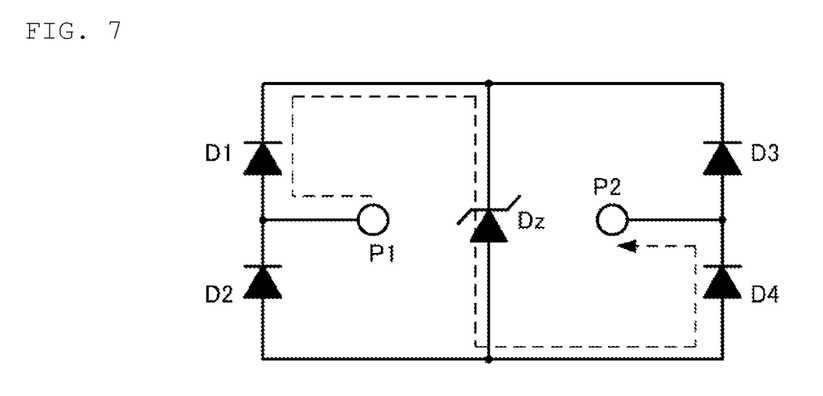
FIG. 7 is a diagram for explaining a principle for operation of an ESD protection device according to an embodiment.
Figure 8:
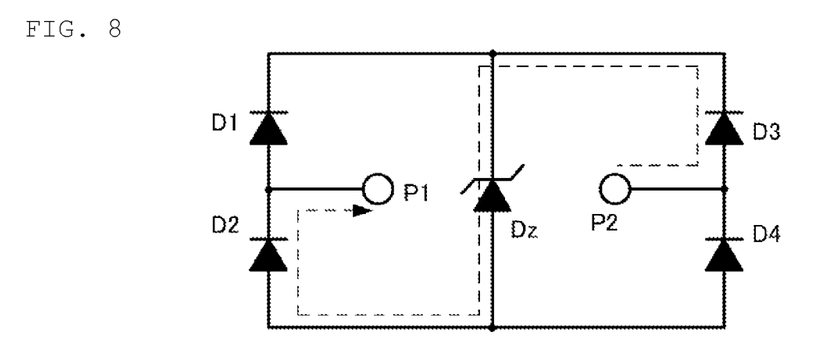
FIG. 8 is a diagram for explaining a principle for operation of an ESD protection device according to an embodiment.

FIGS. 7 and 8 are diagrams for explaining a principle for operation of the ESD protection device according to the present embodiment.

FIG. 7 is a diagram for explaining a case in which a current flows from an input/output port P1 (Al electrode film 121) leading to the first input/output terminal (external electrode 23A), to an input/output port P2 (Al electrode film 131) leading to the second input/output terminal (external electrode 23B). When a surge voltage in excess of the zener voltage of the zener diode Dz is applied, a surge current coming from the first input terminal flows through a pathway from the input/output port P1 to the diode D1, the zener diode Dz, and the diode D4, and is discharged from the input/output port P2 to the ground, as indicated by a dashed line in the figure.

FIG. 8 is a diagram for explaining a case in which a current flows from the input/output port P2 leading to the second input/output terminal (external electrode 23B), to the input/output port P1 leading to the first input/output terminal (external electrode 23A). In this case, as indicated by a dashed line in the figure, a surge current coming from the second input terminal flows through a pathway from the input/output port P2 to the diode D3, the zener diode Dz, and the diode D2, and is discharged from the input/output port P1 to the ground.

Next, the reason that the ESD protection device 1 according to the present embodiment can reduce parasitic capacitance will be described.

Figure 9A:
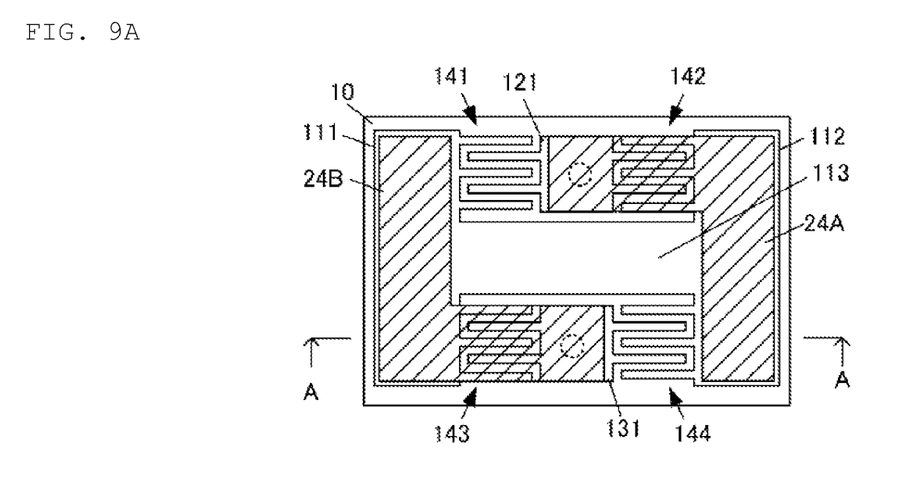
FIG. 9A is a plan view of a main part of an ESD protection device.
Figure 9B:
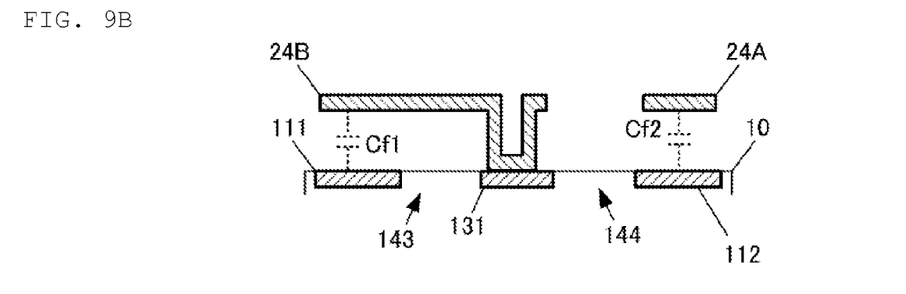
FIG. 9B is a cross-sectional view of FIG. 9A along the line A-A.
Figure 10A:
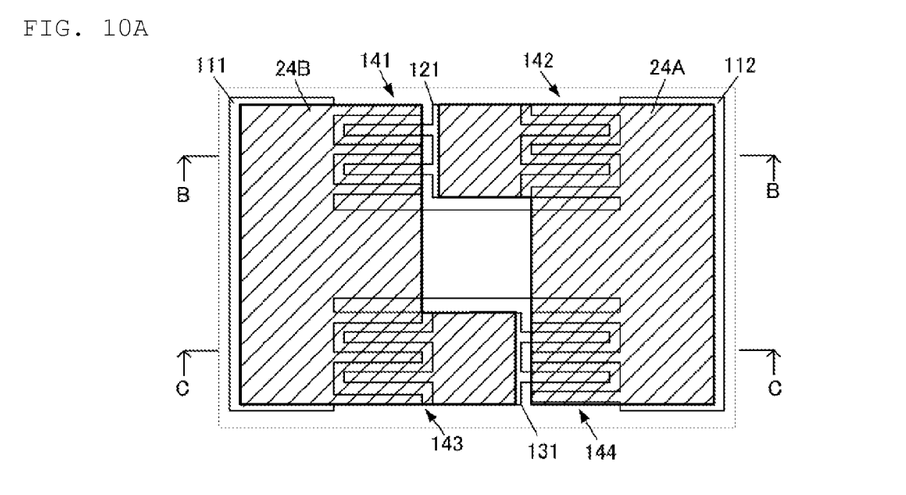
FIG. 10A is a plan view in the case of constituting diode forming regions covered with Ti/Cu/Ti electrodes.

FIG. 9A is a plan view of a main part of the ESD protection device, and FIG. 9B is a cross-sectional view of FIG. 9A along the line A-A. In addition, FIG. 10 is provided as an example, by way of comparison with the ESD protection device 1 according to the present embodiment. FIG. 10A is a plan view in the case of constituting the diode forming regions 141, 144 covered with the Ti/Cu/Ti electrodes 24A, 24B, FIG. 10B is a cross-sectional view of FIG. 10A along the line B-B, and FIG. 10C is a cross-sectional view of FIG. 10A along the line C-C.

Figure 10B:
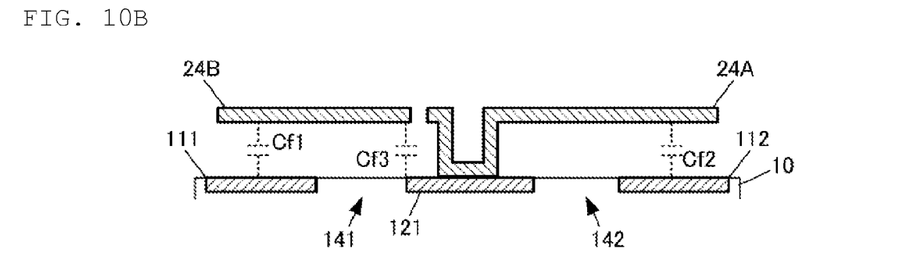
FIG. 10B is a cross-sectional view of FIG. 10A along the line B-B.

In the present embodiment, as shown in FIG. 10B, parasitic capacitance Cf1 is generated between the Al electrode film 111 of the Si substrate 10 and the Ti/Cu/Ti electrode 24A, and parasitic capacitance Cf2 is generated between the Al electrode film 112 and the Ti/Cu/Ti electrode 24B.

Figure 10C:
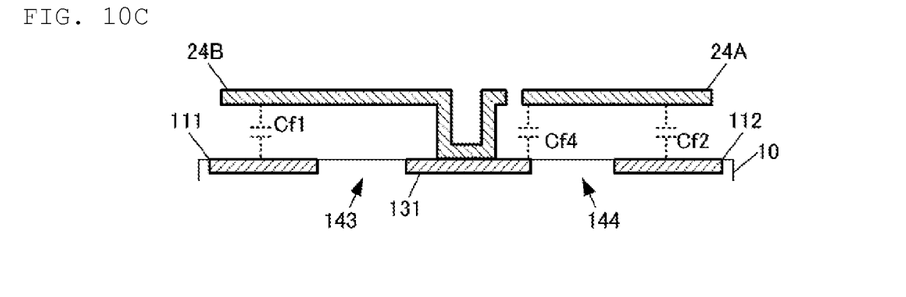
FIG. 10C is a cross-sectional view of FIG. 10A along the line C-C.

In contrast, in the configuration shown in FIG. 10A, furthermore, parasitic capacitance Cf3 is generated between the comb-shaped electrode connected to the Al electrode film 121 and the Ti/Cu/Ti electrode 24A (see FIG. 10B), and parasitic capacitance Cf4 is generated between the comb-shaped electrode connected to the Al electrode film 131 and the Ti/Cu/Ti electrode 24B (see FIG. 10C).

Figure 11:
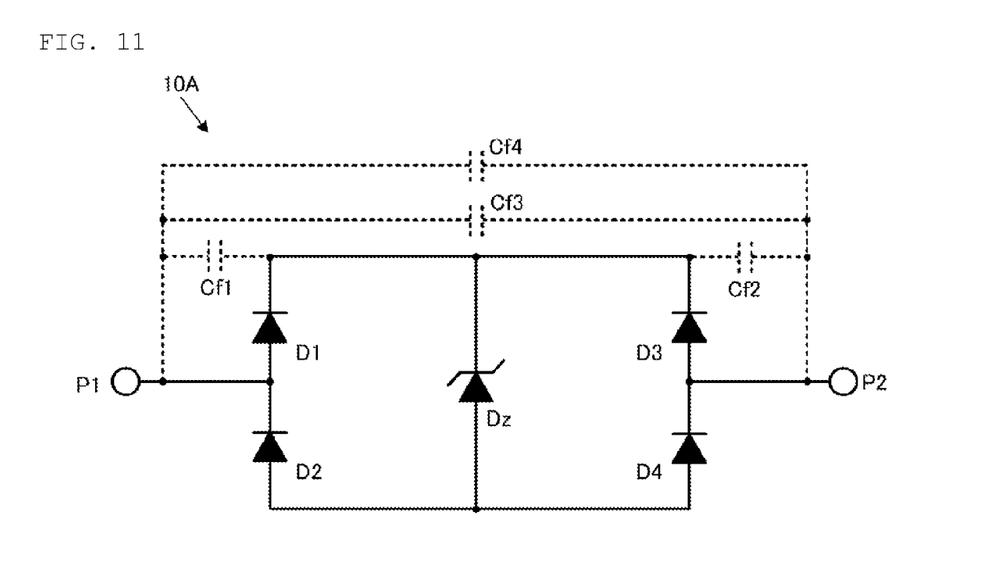
FIG. 11 is a diagram illustrating an ESD protection circuit formed on a Si substrate, in consideration of parasitic capacitance.

FIG. 11 is a diagram illustrating the ESD protection circuit 10A formed on the Si substrate 10, in consideration of parasitic capacitance. In the case of the ESD protection device 1 according to the present embodiment, only a series circuit of the parasitic capacitance Cf1, Cf2 is formed, because the parasitic capacitance Cf3, Cf4 is not generated. On the other hand, when the parasitic capacitance Cf3, Cf4 is generated, the parasitic capacitance Cf3, Cf4 is connected in parallel with the series circuit of the parasitic capacitance Cf1, Cf2. As a result, the impedance of the ESD protection device 1 is lowered. Therefore, when the parasitic capacitance Cf3, Cf4 is generated, the use in high frequency bands becomes impossible. In contrast, the ESD protection device 1 according to the present embodiment can reduce the generation of parasitic capacitance, thus making the use possible in high frequency bands.

Figure 12:
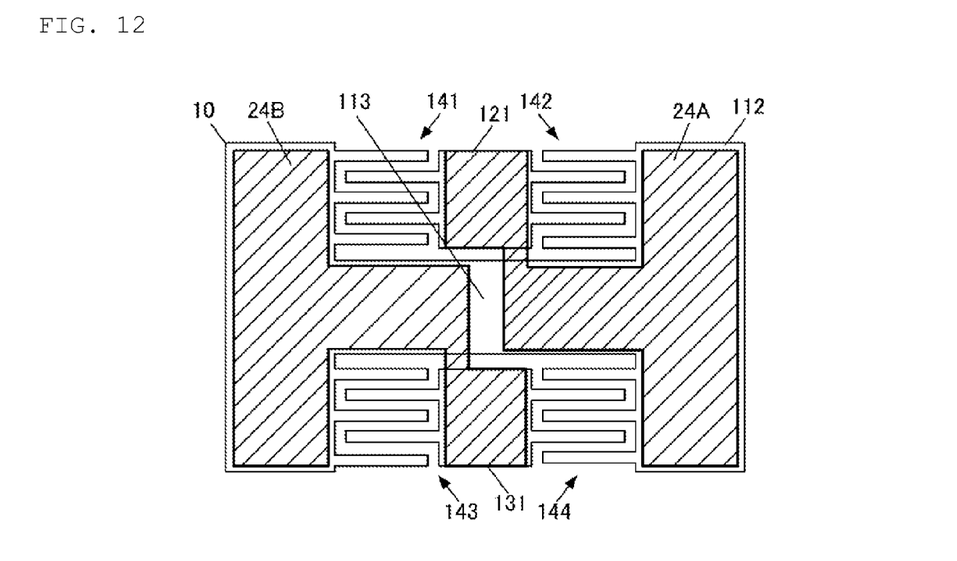
FIG. 12 is a diagram illustrating an example configured without covering diode forming regions with Ti/Cu/Ti electrodes.

FIG. 12 is a diagram illustrating an example configured without covering the diode forming regions 141, 144 with the Ti/Cu/Ti electrodes 24A, 24b. In this example, the Ti/Cu/Ti electrode 24A is opposed to the Al electrode film 113, but not opposed to the diode forming regions 143, 144. In addition, the Ti/Cu/Ti electrode 24B is opposed to the Al electrode film 113, but not opposed to the diode forming regions 141, 142. In this case, because of the large opposed areas between the Ti/Cu/Ti electrodes 24A, 24B and the Al electrode film 113, the parasitic capacitance generated therebetween is increased. Furthermore, because the distance between the Ti/Cu/Ti electrodes 24A, 24B is closed as compared with the case in FIG. 9 according to the present embodiment, the parasitic capacitance generated therebetween is also increased. Accordingly, also in the case as shown in FIG. 12, the impedance of the ESD protection device 1 is lowered.

A process for manufacturing the ESD protection device will be described below.

Figure 13:
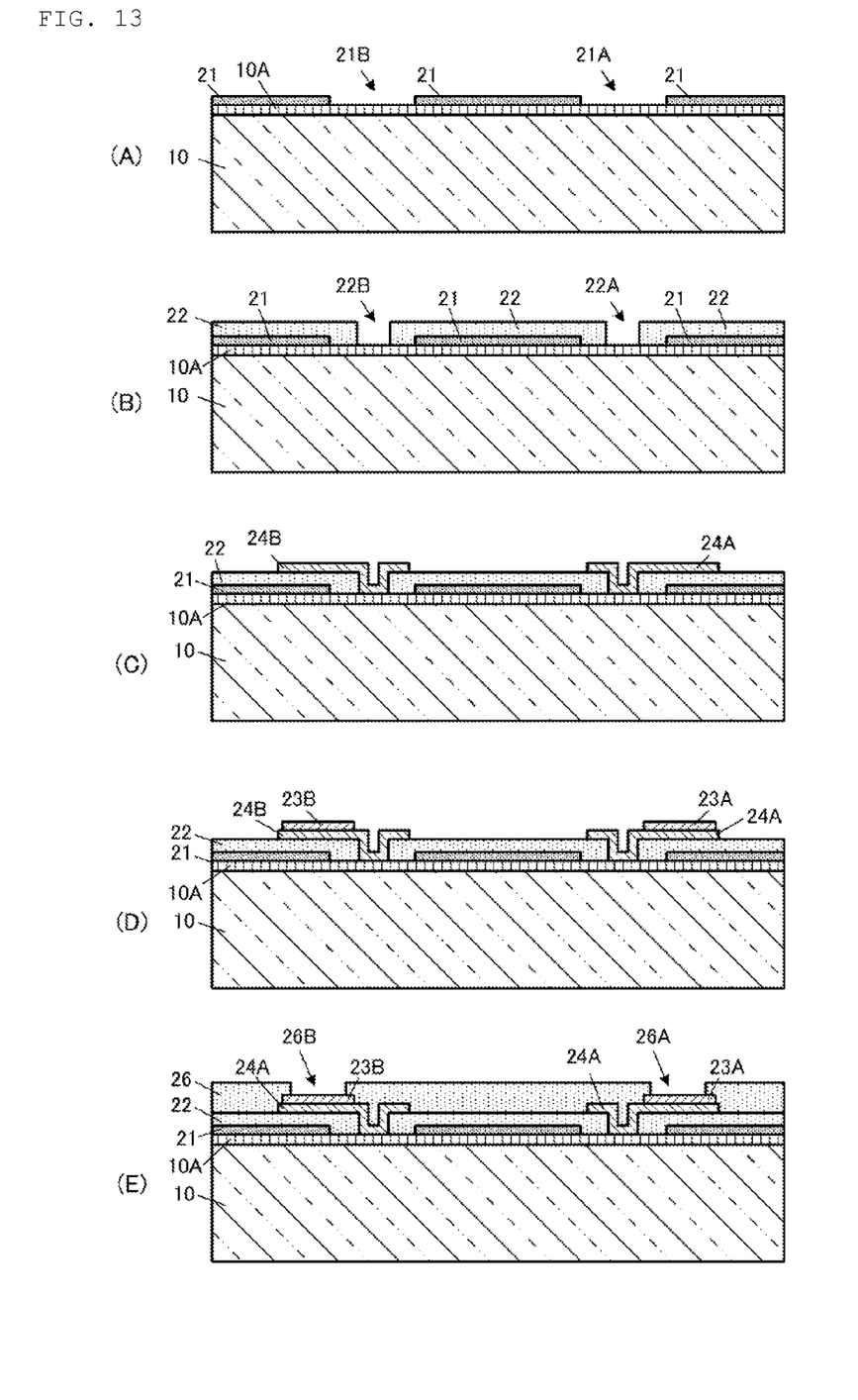
FIG. 13 is a diagram illustrating a process for manufacturing an ESD protection device.

FIG. 13 is a diagram illustrating a process for manufacturing the ESD protection device 1. The ESD protection device 1 is manufactured in accordance with the following process.

(A) First, an insulating film is formed on the Si substrate 10 with the ESD protection circuit 10A formed, openings are provided at predetermined sites of the insulating film, and the Al electrode films 111, 112, 113, 121, 131 are formed by vapor deposition. Further, the protection film 21 is made by sputtering onto the surface of the Si substrate 10, and openings 21A, 21B are formed by etching.

(B) Next, the Si substrate 10 is subjected to spin coating with an epoxy solder resist to form the resin layer 22, and the contact holes 22A, 22B are formed. The formation of the resin layer 22 can achieve leveling of the surfaces on which the Ti/Cu/Ti electrodes 24A, 24B are formed.

(C) On the surface of the resin layer 22, Ti/Cu/Ti are deposited by sputtering to be approximately 0.1 μm/1.0 μm/0.1 μm in thickness, and then subjected to wet etching to form the electrodes 24A, 24B.

(D) The surfaces of the Ti/Cu/Ti electrodes 24A, 24B are partially etched to expose Cu, and on the exposed Cu parts, the external electrodes 23A, 23B of Au/Ni are deposited by electrolytic plating (electroplating) to be approximately 0.1 μm/3.0 μm in thickness. With the external electrodes 23A, 23B, only the exposed Cu parts are selectively plated. The deposition of the external electrodes 23A, 23B by selective plating facilitates the manufacture without forming any resist film, and because any masking is required.

(E) Thereafter, the surface of the resin layer 22 is subjected to spin coating with an epoxy solder resist to form the resin layer 26. The openings 26A, 26B are formed in the resin layer 26.

It is to be noted that while the ESD protection devices including the zener diodes are described in the embodiments described above, the ESD protection devices are not limited to the embodiments, but may include, for example, a PNP-type semiconductor or an NPN-type semiconductor.

DESCRIPTION OF REFERENCE SYMBOLS

1 ESD protection device (semiconductor device)
10 Si substrate (semiconductor substrate)
10A ESD protection circuit
20 rewiring layer
21 protection film
22,26 resin layer
22A contact hole (first contact hole)
22B contact hole (second contact hole)
23A, 23B external electrode
24A, 24B Ti/Cu/Ti electrode
26A, 26B opening
111 Al electrode film (first intermediate wiring electrode)
112 Al electrode film (second intermediate wiring electrode)
113 Al electrode film (third intermediate wiring electrode)
121 Al electrode film (first input/output electrode)
131 Al electrode film (second input/output electrode)
D1, D2, D3, D4 diode (functional element)
Dz zener diode (functional element)
P1 port (metallic film)
P2 port (metallic film)

The invention claimed is:

1. A semiconductor device comprising:
a first diode and a second diode formed in a semiconductor substrate;
a first input/output electrode coupled to an end of the first diode, a second input/output electrode coupled to an end of the second diode, and an intermediate electrode coupled to another end of the first diode and another end of the second diode, where the first and second input/output electrodes and the intermediate electrode are each formed on a surface of the semiconductor substrate; and
a first wiring electrode coupled to the first input/output electrode via a first contact hole, and a second wiring electrode coupled to the second input/output electrode via a second contact hole, where the first and second wiring electrodes are each formed in a rewiring layer disposed on the surface of the semiconductor substrate,
wherein the first wiring electrode is drawn in a region that has an overlap with the first input/output electrode and the intermediate electrode, but does not overlap a forming region of the second diode in planar view of the semiconductor device, and
wherein the second wiring electrode is drawn in a region that has an overlap with the second input/output electrode and the intermediate electrode, but does not overlap a forming region of the first diode in planar view of the semiconductor device.

2. The semiconductor device according to claim 1, wherein the first and second diodes constitute an electrostatic discharge (ESD) protection circuit, and the first and second wiring electrodes form a current path for ESD current.

3. The semiconductor device according to claim 1,
wherein a first comb-shaped electrode electrically coupled to the first input/output electrode and a second comb-shaped electrode electrically coupled to the intermediate electrode are each coupled to the first diode, and
wherein a third comb-shaped electrode electrically coupled to the intermediate electrode and a fourth comb-shaped electrode electrically coupled to the second input/output electrode are each coupled to the second diode.

4. The semiconductor device according to claim 3, wherein the intermediate electrode includes:
a pair of first and second intermediate electrodes that oppose each other in a first direction that is a longitudinal direction; and
a third intermediate electrode disposed in a second direction orthogonal to the first direction, the third intermediate electrode electrically connecting the first intermediate electrode and the second intermediate electrode,
wherein:
the first and second input/output electrodes are disposed in regions surrounded by the first intermediate electrode and the second intermediate electrode as well as the third intermediate electrode, and disposed to oppose each other with the third intermediate electrode interposed therebetween,
the first diode is formed in the region between the first input/output electrode and the first intermediate electrode,
the second diode is formed in the region between the second input/output electrode and the second intermediate electrode,
the first wiring electrode comprises a shape that at least partially overlaps at least the second intermediate electrode and the first input/output electrode, and
the second wiring electrode comprises a shape that at least partially overlaps at least the first intermediate electrode and the second first input/output electrode.

* * * * *